United States Patent
Nam et al.

(10) Patent No.: US 7,439,825 B2
(45) Date of Patent: Oct. 21, 2008

(54) INTEGRATED FILTER INCLUDING FBAR AND SAW RESONATOR AND FABRICATION METHOD THEREFOR

(75) Inventors: Kuang-woo Nam, Seoul (KR); Kook-hyun Sunwoo, Hwanseong-si (KR); In-sang Song, Seoul (KR); Sang-wook Kwon, Seongnam-si (KR); Duck-hwan Kim, Goyang-si (KR); Chul-soo Kim, Hwanseong-si (KR); Sang-chul Sul, Suwon-si (KR); Yun-kwon Park, Dongducheon-si (KR); Hae-seok Park, Yongin-si (KR); Jea-shik Shin, Suwon-si (KR); Dong-ha Shim, Seoul (KR); Young-tack Hong, Suwon-si (KR); Jong-seok Kim, Hwanseong-si (KR); Seok-mo Chang, Incheon (KR); Seok-chul Yun, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 313 days.

(21) Appl. No.: 11/448,707

(22) Filed: Jun. 8, 2006

(65) Prior Publication Data

US 2007/0024396 A1    Feb. 1, 2007

(30) Foreign Application Priority Data

Jul. 27, 2005    (KR)    ............ 10-2005-0068486

(51) Int. Cl.
*H03H 9/56* (2006.01)
*H03H 9/54* (2006.01)

(52) U.S. Cl. .................................. 333/191; 333/187
(58) Field of Classification Search ............. 333/133, 333/187, 189, 191; 310/334
See application file for complete search history.

(56) References Cited

U.S. PATENT DOCUMENTS

| 6,710,681 | B2 * | 3/2004 | Figueredo et al. | 333/187 |
| 7,053,730 | B2 * | 5/2006 | Park et al. | 333/133 |
| 7,233,219 | B2 * | 6/2007 | Inoue et al. | 333/193 |

* cited by examiner

*Primary Examiner*—Daniel D Chang
(74) *Attorney, Agent, or Firm*—Sughrue Mion, PLLC

(57) ABSTRACT

An integrated filter including a film bulk acoustic resonator (FBAR) and a surface acoustic wave (SAW) resonator and a method of fabricating the integrated filter. The integrated filter includes: a substrate; a first electrode positioned in a predetermined first area on an upper surface of the substrate; a first piezoelectric layer positioned on the first electrode; a second electrode positioned on the first piezoelectric layer; a second piezoelectric layer positioned in a predetermined second area on the upper surface of the substrate; and at least one inter-digital transducer (IDT) electrode positioned on the second piezoelectric layer. The IDT electrode includes: a first IDT electrode formed in a comb structure on the second piezoelectric layer; and a second IDT electrode formed in a comb structure on the second piezoelectric layer so as to mesh with the first IDT electrode. The first and second piezoelectric layers are formed of an identical material. Thus, an integrated filter which operates in various frequency bands can be made compact.

7 Claims, 3 Drawing Sheets

INTEGRATED FILTER INCLUDING FBAR AND SAW RESONATOR AND FABRICATION METHOD THEREFOR

CROSS-REFERENCE TO RELATED APPLICATIONS

This application claims priority from Korean Patent Application No. 2005-0068486 filed Jul. 27, 2005, in the Korean Intellectual Property Office, the disclosure of which is incorporated herein by reference.

BACKGROUND OF THE INVENTION

1. Field of the Invention

An apparatus and a method consistent with the present invention relate to a filter and a method for fabricating the same and, more particularly, to an integrated filter including a film bulk acoustic resonator (FBAR) and a surface acoustic wave (SAW) resonator and a method of fabricating the same.

2. Description of the Related Art

With the rapid popularization of mobile communication devices representative of portable phones, demand for compact, light filters and duplexers used in the mobile communication devices has increased. FBARs and SAW resonators are used as members for realizing filters.

The FBARs can be mass-produced in a small size and at a minimum cost. The FBARs can also realize quality factor (Q) values that are desirable characteristics of filters.

In general, such an FBAR includes a resonance part in which a lower electrode, a piezoelectric layer, and an upper electrode are sequentially stacked on a substrate. Describing the operation principle of the FBAR, an electric energy is applied to the lower and upper electrodes to induce an electric field varying with time in the piezoelectric layer, and the electric field generates a bulk acoustic wave in a direction toward which the resonance part vibrates, in the piezoelectric layer so as to produce a resonance.

SAW filters have simple structures and thus can be mass-produced. In other words, the SAW filters include inter-digital transducer (IDT) electrodes fabricated in comb structures on piezoelectric substrates. Since patterns of the comb structures of the IDT electrodes are minute in this case, it is difficult to design the SAW filters so as to be used in a frequency band having a predetermined intensity or more. Thus, the SAW filters are generally used in a low frequency band.

In the prior art, a filter is realized using a hybrid method of connecting an FBAR and a SAW resonator to be used in various frequency bands. In this case, a usable frequency band is widened. However, a connection process is complicated, and thus yield is reduced.

Also, a plurality of resonators separately fabricated are connected to one another and used. Thus, the entire size of the filter increased. As a result, it is difficult to use the filter in a compact electronic device such as a portable phone.

SUMMARY OF THE INVENTION

Accordingly, the present general inventive concept has been made to address the above-mentioned problems, and an aspect of the present general inventive concept is to provide an integrated filter including an FBAR and a SAW resonator and a method of fabricating the same.

According to an aspect of the present invention, there is provided an integrated filter including: a substrate; a first electrode positioned in a predetermined first area on an upper surface of the substrate; a first piezoelectric layer positioned on the first electrode; a second electrode positioned on the first piezoelectric layer; a second piezoelectric layer positioned in a predetermined second area on the upper surface of the substrate; and at least one IDT (inter-digital transducer) electrode positioned on the second piezoelectric layer.

The at least one IDT electrode may include: a first IDT electrode formed in a comb structure on the second piezoelectric layer; and a second IDT electrode formed in a comb structure on the second piezoelectric layer so as to mesh with the first IDT electrode.

The first and second piezoelectric layers may be formed of an identical material.

The integrated filter may further include: a first cavity formed underneath the first electrode; and a second cavity formed underneath the second piezoelectric layer.

The integrated filter may further include: a first pad connected to the first electrode; a second pad connected to the second electrode; a third pad connected to the first IDT electrode; and a fourth pad connected to the second IDT electrode.

According to another aspect of the present invention, there is provided a method of fabricating an integrated filter, including: forming a first electrode in a predetermined first area on a substrate; stacking and patterning a piezoelectric material on the substrate to form a first piezoelectric layer positioned on the first electrode and a second electrode positioned in a predetermined second area on the second piezoelectric layer; stacking and patterning a conductive material on the substrate to form a second electrode positioned on the first piezoelectric layer and at least one IDT electrode positioned on the second piezoelectric layer; and etching portions of the substrate underneath the predetermined first and second areas to form cavities.

The IDT electrode may include a first IDT electrode patterned in a comb structure and a second IDT electrode patterned in a comb structure so as to mesh with the first IDT electrode.

BRIEF DESCRIPTION OF THE DRAWINGS

The above aspects and features of the present invention will be more apparent by describing exemplary embodiments of the present invention with reference to the accompanying drawings, in which.

Figure 1:
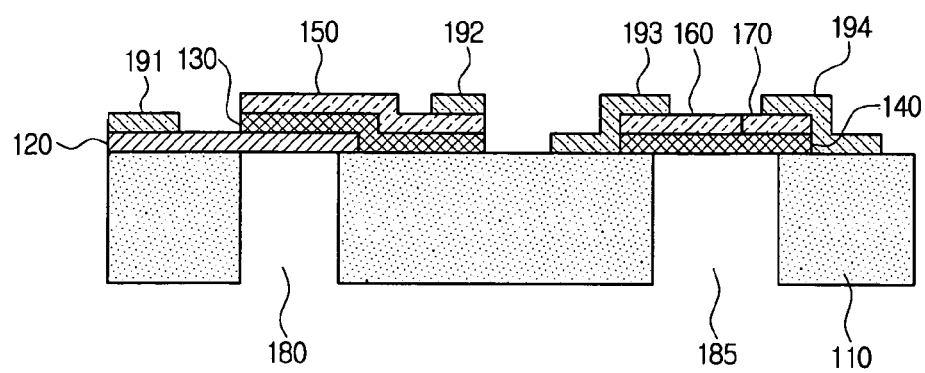
FIG. 1 is a cross-sectional view of an integrated filter according to an exemplary embodiment of the present invention.

DETAILED DESCRIPTION OF THE ILLUSTRATIVE, NON-LIMITING EMBODIMENTS OF THE INVENTION

Illustrative, non-limiting embodiments of the present invention will be described in greater detail with reference to the accompanying drawings.

In the following description, the same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they are not necessary for understanding the invention.

FIG. 1 is a cross-sectional view of an integrated filter according to an exemplary embodiment of the present invention. Referring to FIG. 1, the integrated filter includes a substrate 110, a first electrode 120, a first piezoelectric layer 130, a second piezoelectric layer 140, a second electrode 150, a first IDT electrode 160, a second IDT electrode 170, a first cavity 180, a second cavity 185, and first through fourth pads 191 through 194.

The substrate 110 may be formed of a general silicon wafer.

The first electrode 120 is positioned in a predetermined first area on an upper surface of the substrate 110. The first electrode 120 may be formed of a conductive material such as a metal.

The first piezoelectric layer 130 is positioned on the first electrode 120 and an area of the substrate 110 on the periphery of the first electrode 120. In this case, the first piezoelectric layer 130 may be positioned only on the first electrode 120 but may extend to the area of the substrate 110 on the periphery of the first electrode 120 as shown in FIG. 1 so as to be supported by the substrate 110.

The second electrode 150 is positioned on the first piezoelectric layer 130. The second electrode 150 may also be formed of a general conductive material such as a metal.

The first electrode 120, the first piezoelectric layer 130, and the second electrode 150 constitute an FBAR. In this case, a portion of the substrate 110 underneath the predetermined first area may be etched to form the first cavity 180 so as to realize an air gap type FBAR. Thus, if a power source is connected to the first and second electrodes 120 and 150, the first piezoelectric layer 130 produces a piezoelectric phenomenon so as to perform a resonance in a perpendicular direction to a surface of the substrate 110. An acoustic wave generated during the resonance is reflected from the first cavity 180 so as to improve a resonance characteristic.

The second piezoelectric layer 140 is positioned in a predetermined second area on the upper surface of the substrate 110. The second piezoelectric layer 140 may be formed together with the first piezoelectric layer 130. In other words, a piezoelectric material may be stacked on the upper surface of the substrate 110 and then patterned so as to form the first and second piezoelectric layers 130 and 140 at the same time.

An IDT electrode is positioned on the second piezoelectric layer 140. The IDT electrode includes the first and second IDT electrodes 160 and 170. The first IDT electrode 160 is formed in a comb pattern on the second piezoelectric layer 140 so as to be placed on the piezoelectric layer 140 in a horizontal state. Also, the second IDT electrode 170 is formed in a comb pattern so as to gear with the first IDT electrode 160. Thus, the second piezoelectric layer 140, the first IDT electrode 160, and the second IDT electrode 170 constitute a SAW resonator. If power sources are respectively connected to the first and second IDT electrodes 160 and 170, the second piezoelectric layer 140 produces a piezoelectric phenomenon so as to perform a resonance in a horizontal direction to the surface of the substrate 110. In this case, the predetermined second area of the substrate 110 may be etched to form the second cavity 185 so as to improve a resonance characteristic of the SAW resonator.

The first and second electrodes 120 and 150 and the first and second IDT electrodes 160 and 170 are connected to the first through fourth pads 191 through 194, respectively. The first through fourth pads 191 through 194 connect the first and second electrodes 120 and 150 and the first and second IDT electrodes 160 and 170 to external power sources, respectively.

Figure 2:
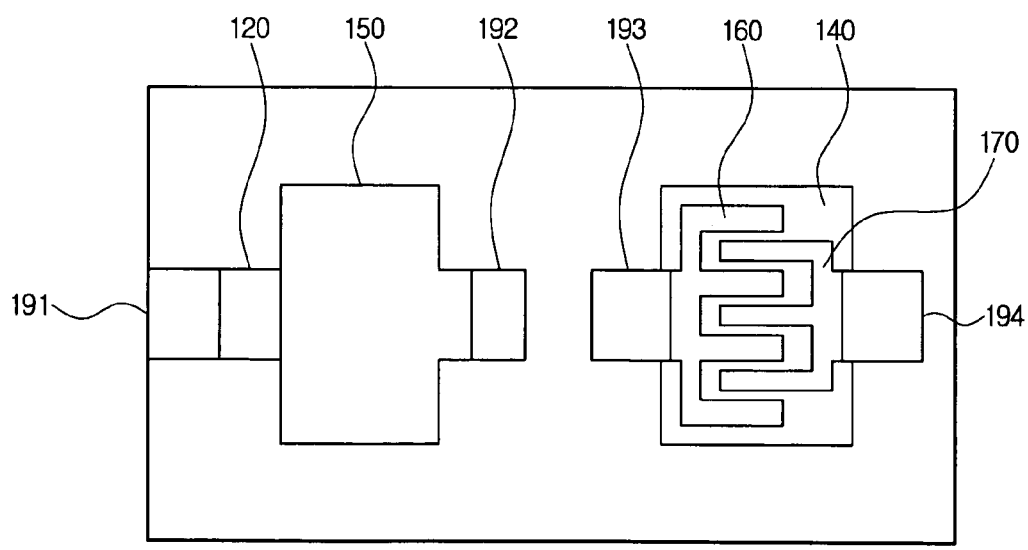
FIG. 2 is a plan view of the integrated filter shown in FIG. 1.

FIG. 2 is a plan view of the integrated filter shown in FIG. 1. Referring to FIG. 2, the FBAR and the SAW resonator are integrated on the substrate 110.

In other words, the first piezoelectric layer 130 and the first electrode 120 are positioned underneath the second electrode 150 so as to realize the FBAR. The first pad 191 is connected to the first electrode 120, and the second pad 192 is connected to the second electrode 150.

The first and second IDT electrodes 160 and 170 as comb structures gear with each other on the second piezoelectric layer 140 so as to realize the SAW resonator. The third pad 193 is connected to the first IDT electrode 160, and the fourth pad 194 is connected to the second IDT electrode 170.

Figure 3A:
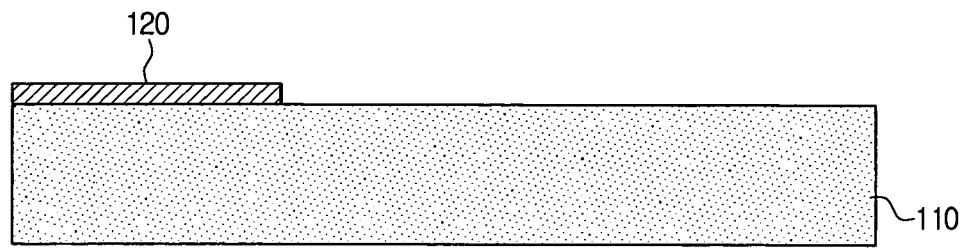
FIGS. 3A through 3E are cross-sectional views illustrating a method for fabricating the integrated filter shown in FIG. 1.

FIGS. 3A through 3E are cross-sectional views illustrating a method of fabricating the integrated filter shown in FIG. 1. Referring to FIG. 3A, the first electrode 120 is formed in the predetermined first area on the substrate 110. In detail, a conductive material such as a metal may be stacked and patterned to form the first electrode 120.

Figure 3B:
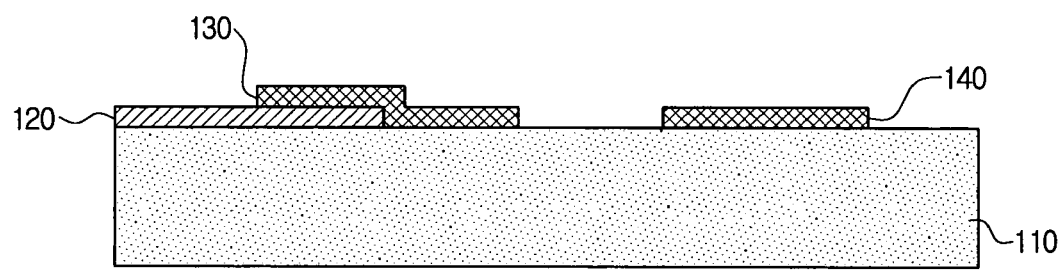

As shown in FIG. 3B, the first and second piezoelectric layers 130 and 140 are formed. In detail, a piezoelectric material is stacked on an entire surface of the substrate 110 including the predetermined first area in which the first electrode 120 has been formed, and then a portion of the piezoelectric material stacked on the remaining portion of the first electrode 120 and the remaining portion of the substrate 110 except an area of the first electrode 120 and an area of the substrate 110 is removed, so as to form the first and second piezoelectric layers 130 and 140 at the same time. The piezoelectric material may be AlN, ZnO, or the like. As described above, a piezoelectric layer necessary for a SAW resonator may be formed during forming of a piezoelectric layer necessary for an FBAR. Thus, an additional SAW resonator does not need to be fabricated on and bonded to a piezoelectric substrate.

Figure 3C:
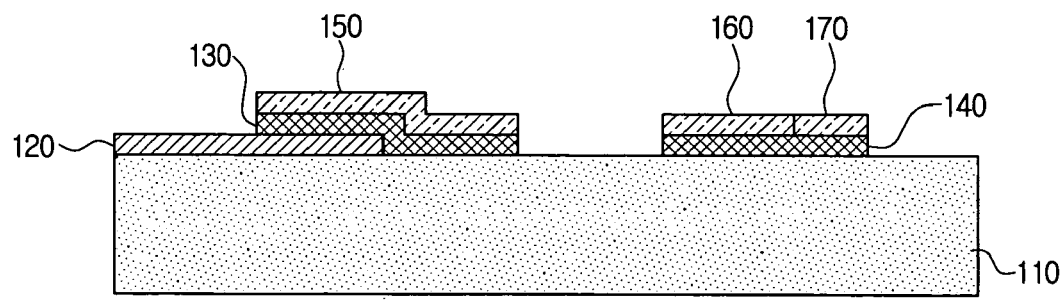

As shown in FIG. 3C, the second electrode 150, the first IDT electrode 160, and the second IDT electrode 170 are formed. In detail, a conductive material may be stacked and patterned on the entire surface of the substrate 110 including the first electrode 120 and the first and second piezoelectric layers 130 and 140 so as to form the second electrode 150 and the first and second IDT electrodes 160 and 170 at the same time.

Figure 3D:
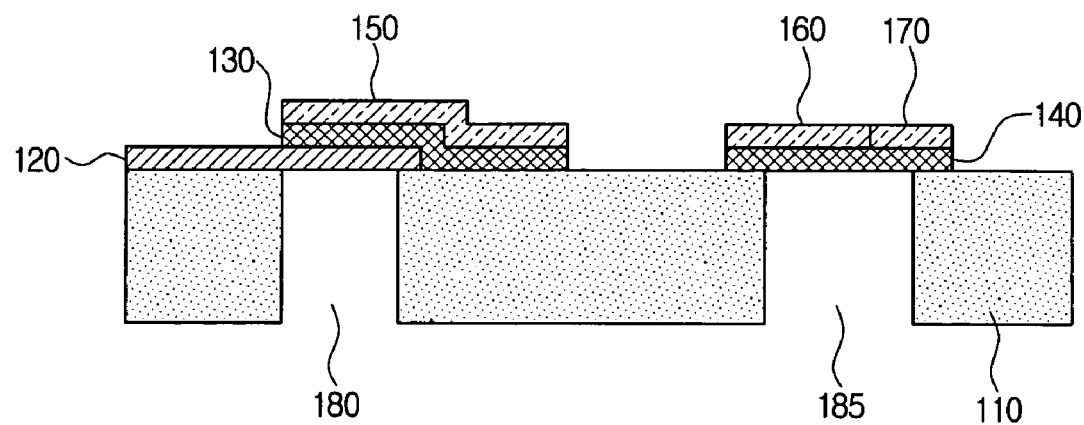

As shown in FIG. 3D, portions of the substrate 110 underneath the first electrode 120 and the second piezoelectric layer 140 may be etched to form the first and second cavities 180 and 185. In detail, viaholes (not shown) may be formed in an upper or lower portion of the substrate 110, and then an etchant or a gas may be injected through the viaholes to etch the substrate 110 so as to form the first and second cavities 180 and 185.

Figure 3E:
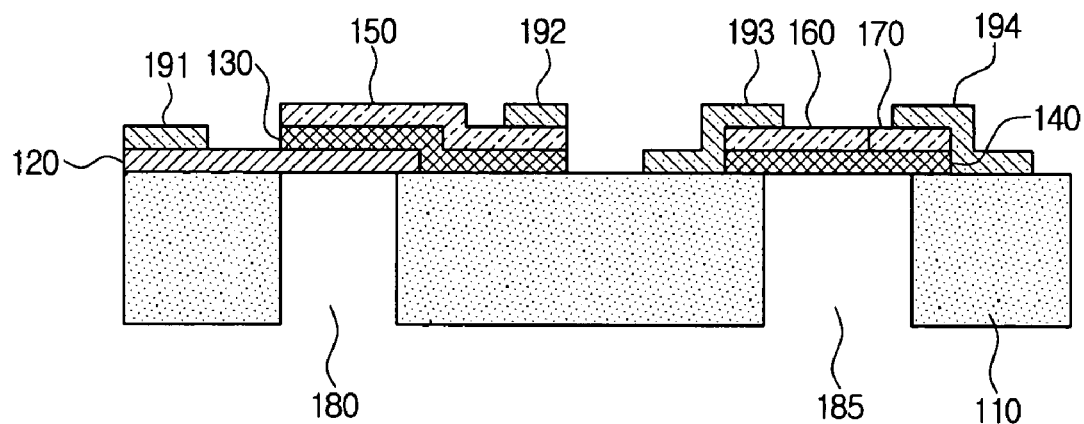

As shown in FIG. 3E, the first through fourth pads 191 through 194 are formed. In detail, a conductive material may be stacked and patterned on the entire surface of the substrate 110 including the first and second electrodes 120 and 150 and the first and second IDT electrodes 160 and 170 so as to form the first through fourth pads 191 through 194. An external power source may be applied to the FBAR or the SAW resonator using the first through fourth pads 191 through 194 so as to perform filtering in various frequency bands.

As described above, according to the present invention, an FBAR and a SAW resonator can be integrated on a substrate.

Thus, a filter operating in various frequency bands can be made compact. As a result, manufacturing yield can be improved.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An integrated filter comprising:
   a substrate;
   a first electrode positioned in a predetermined first area on an upper surface of the substrate;
   a first piezoelectric layer positioned on the first electrode;
   a second electrode positioned on the first piezoelectric layer;
   a second piezoelectric layer positioned in a predetermined second area on the upper surface of the substrate; and
   at least one inter-digital transducer (IDT) electrode positioned on the second piezoelectric layer.

2. The integrated filter of claim 1, wherein the at least one IDT electrode comprises:
   a first IDT electrode formed in a comb structure on the second piezoelectric layer; and
   a second IDT electrode formed in a comb structure on the second piezoelectric layer so as to mesh with the first IDT electrode.

3. The integrated filter of claim 2, wherein the first and second piezoelectric layers are formed of an identical material.

4. The integrated filter of claim 3, further comprising:
   a first cavity formed underneath the first electrode; and
   a second cavity formed underneath the second piezoelectric layer.

5. The integrated filter of claim 2, further comprising:
   a first pad connected to the first electrode;
   a second pad connected to the second electrode;
   a third pad connected to the first IDT electrode; and
   a fourth pad connected to the second IDT electrode.

6. A method of fabricating an integrated filter, comprising:
   forming a first electrode in a predetermined first area on a substrate;
   stacking and patterning a piezoelectric material on the substrate to form a first piezoelectric layer positioned on the first electrode and a second electrode positioned in a predetermined second area on a second piezoelectric layer;
   stacking and patterning a conductive material on the substrate to form a second electrode positioned on the first piezoelectric layer and at least one inter-digital transducer (IDT) electrode positioned on the second piezoelectric layer; and
   etching portions of the substrate underneath the predetermined first and second areas to form cavities.

7. The method of claim 6, wherein the at least one IDT electrode comprises a first IDT electrode patterned in a comb structure and a second IDT electrode patterned in a comb structure so as to mesh with the first IDT electrode.

* * * * *